(12) United States Patent
Hautmann et al.

(10) Patent No.: US 7,624,538 B2
(45) Date of Patent: Dec. 1, 2009

(54) DOOR OR GATE

(75) Inventors: Dieter Hautmann, Schwarzenbach (DE); Jürgen Hofmann, Tauperlitz (DE); Oliver Sommer, Hof/Saale (DE)

(73) Assignee: Sommer Metallbau-Stahlbau GmbH & Co. KG, Dohlau (DE)

( * ) Notice: Subject to any disclaimer, the term of this patent is extended or adjusted under 35 U.S.C. 154(b) by 230 days.

(21) Appl. No.: 11/542,251

(22) Filed: Oct. 4, 2006

(65) Prior Publication Data

US 2007/0095568 A1    May 3, 2007

(30) Foreign Application Priority Data

Oct. 11, 2005    (DE)    ........................ 10 2005 048 700

(51) Int. Cl.
  *E06B 7/18*    (2006.01)
(52) U.S. Cl. ..................... 49/477.1; 49/480.1; 49/498.1; 277/646; 277/652; 277/919; 277/920; 277/921
(58) Field of Classification Search ................ 49/475.1, 49/477.1, 480.1, 498.1; 277/645, 646, 652, 277/919, 920, 921
See application file for complete search history.

(56) References Cited

U.S. PATENT DOCUMENTS

| | | | | |
|---|---|---|---|---|
| 3,304,360 A | * | 2/1967 | Hadley et al. | 174/367 |
| 3,507,974 A | | 4/1970 | Clark et al. | |
| 3,518,355 A | * | 6/1970 | Luce | 174/365 |
| 4,177,353 A | * | 12/1979 | McCormack | 174/374 |
| 4,370,831 A | * | 2/1983 | Hamilton | 49/477.1 |
| 4,399,317 A | * | 8/1983 | Van Dyk, Jr. | 174/364 |
| 4,525,595 A | * | 6/1985 | Harriman | 174/364 |
| 4,656,312 A | * | 4/1987 | Mallott | 174/367 |
| 4,910,920 A | * | 3/1990 | Nichols | 49/484.1 |
| 6,116,615 A | * | 9/2000 | Trehan | 277/630 |

FOREIGN PATENT DOCUMENTS

| | | |
|---|---|---|
| AT | 385 317 | 3/1988 |
| DE | 38 25 343 A1 | 2/1990 |
| DE | 38 25 344 A1 | 2/1990 |
| DE | 39 35 409 A1 | 4/1991 |
| EP | 0 480 135 A1 | 4/1992 |
| EP | 0 541 893 A1 | 5/1993 |
| FR | 2 583 099 | 12/1986 |

* cited by examiner

*Primary Examiner*—Katherine W Mitchell
*Assistant Examiner*—Catherine A Kelly
(74) *Attorney, Agent, or Firm*—Sughrue Mion, PLLC

(57) ABSTRACT

Gate with an at least partially peripheral sealing means, with a retaining strip made from metal, within which the seal is arranged, wherein the seal may be activated pneumatically, with an adjustable plate which is located above the seal and is guided by guide means so as to be adjustable relative to the retaining strip, with an electrically conductive fabric strip which electrically connects the retaining strip to the plate, and with spring contacts which are arranged on the plate, are electrically conductive and may be brought into abutment with the rabbet of the installation frame provided on the building side.

8 Claims, 4 Drawing Sheets

DOOR OR GATE

The invention relates to a door or a gate comprising an at least partially peripheral sealing means.

Various buildings, including hospitals, have to be protected from electromagnetic pulses (EMP) in order to shield equipment from external influences.

An electromagnetic pulse is a very short but extremely powerful electromagnetic wave. The currents induced in electrically conductive material can destroy electrical or electronic devices. Such powerful electromagnetic pulses may, for example, be generated by lightning or atomic bombs.

On explosion of an atomic bomb, the fission and decay processes produce gamma radiation. The gamma radiation affects the surrounding molecules and atoms by the Compton effect. Electrons released by the Compton effect move away from the centre of the explosion at high speed, whereas the ionised atoms are able to move only slowly. As a result of this charge separation, a powerful electromagnetic field is briefly built up. This field soon collapses, as the positively charged ions and electrons in the field start to move toward one another again.

Although the powerful electromagnetic field exists only very briefly, its effects can be serious. The very fact that the field collapses so quickly means that high voltages may be produced in electrically conductive materials. Moreover, as the fields spread at the speed of light, it is also not possible to alert regions that may be affected. The voltages and currents that are produced destroy electrical devices such as transformers, telephone lines, computers or the like, unless they are appropriately shielded.

A distinction is drawn between LEMP (lightning electromagnetic pulses), HEMP (high electromagnetic pulses) and NEMP (nuclear electromagnetic pulses) depending on the cause or the intensity of the electromagnetic pulse generated.

LEMP protective measures are standardised in DIN V V DI V 0185, Part 4 and HEMP protective measures are standardised in DIN EN 61000-2-9.

In order to protect buildings or rooms from high-frequency electromagnetic pulses, the buildings are provided with an electrically conductive fabric having a mesh as required. The entry regions, i.e. the door and gate regions, are however problematic, as when the door or the gate is closed, these regions are also intended to ensure shielding from electromagnetic pulses.

The object of the invention is therefore to provide a door or a gate allowing reliable protection of an opening in a building from high-frequency electromagnetic pulses.

In accordance with the invention, this object is achieved by the following features:

Gate with an at least partially peripheral sealing means, with a retaining strip made from metal, within which the seal is arranged, wherein the seal may be activated pneumatically, with an adjustable plate which is located above the seal and is guided by guide means so as to be adjustable relative to the retaining strip, with an electrically conductive fabric strip which electrically connects the retaining strip to the plate, and with spring contacts which are arranged on the plate, are electrically conductive and may be brought into abutment with the rabbet of the installation frame provided on the building side.

According to one embodiment the seal comprises laterally protruding arms which are fastened in or to the strip using clamping strips and screwing means.

According to another embodiment the strip comprises a substantially U-shaped recess within which the seal 5 is arranged with the clamping strips.

According to another embodiment the spring contacts are fastened to the plate by clamping strips.

According to another embodiment the grooves for receiving an electrically conductive fabric are formed on the top of the plate, the fabric being in electrical contact with the spring contacts.

According to another embodiment the spring contacts have bent-down end portions.

According to another embodiment the spring contacts are continuous in construction along a clamping strip fastened to the plate.

According to another embodiment the spring contacts are slotted at their ends.

According to another embodiment the width of the slots is approximately 1 mm.

According to another embodiment the flexible seal is attached to the clamping strip.

According to another embodiment the fabric strip is formed peripherally at least on a side of the strip.

The arrangement described hereinafter with reference to a gate or a door may in principle be used in revolving doors, sliding gates and revolving gates. In accordance with the invention, shielding from high-frequency electromagnetic pulses is ensured in that there are provided in the region of a pneumatically acting seal spring elements which, on the one hand, are connected to the door or gate-plate so as to conduct electricity effectively and, on the other hand, are pressed, owing to the effect of the pneumatic seal when the door or the gate is closed, against the electrically conductive installation frame attached on the building side.

In order to explain further features, preferred embodiments of the gate according to the invention will be described hereinafter with reference to the drawings, in which.

A preferred embodiment of a gate according to the invention comprising a pneumatic seal with integrated shielding from electromagnetic radiation will be described hereinafter, shielding in the range of from 3 MHz to 3 GHz preferably being desired.

Figure 1:
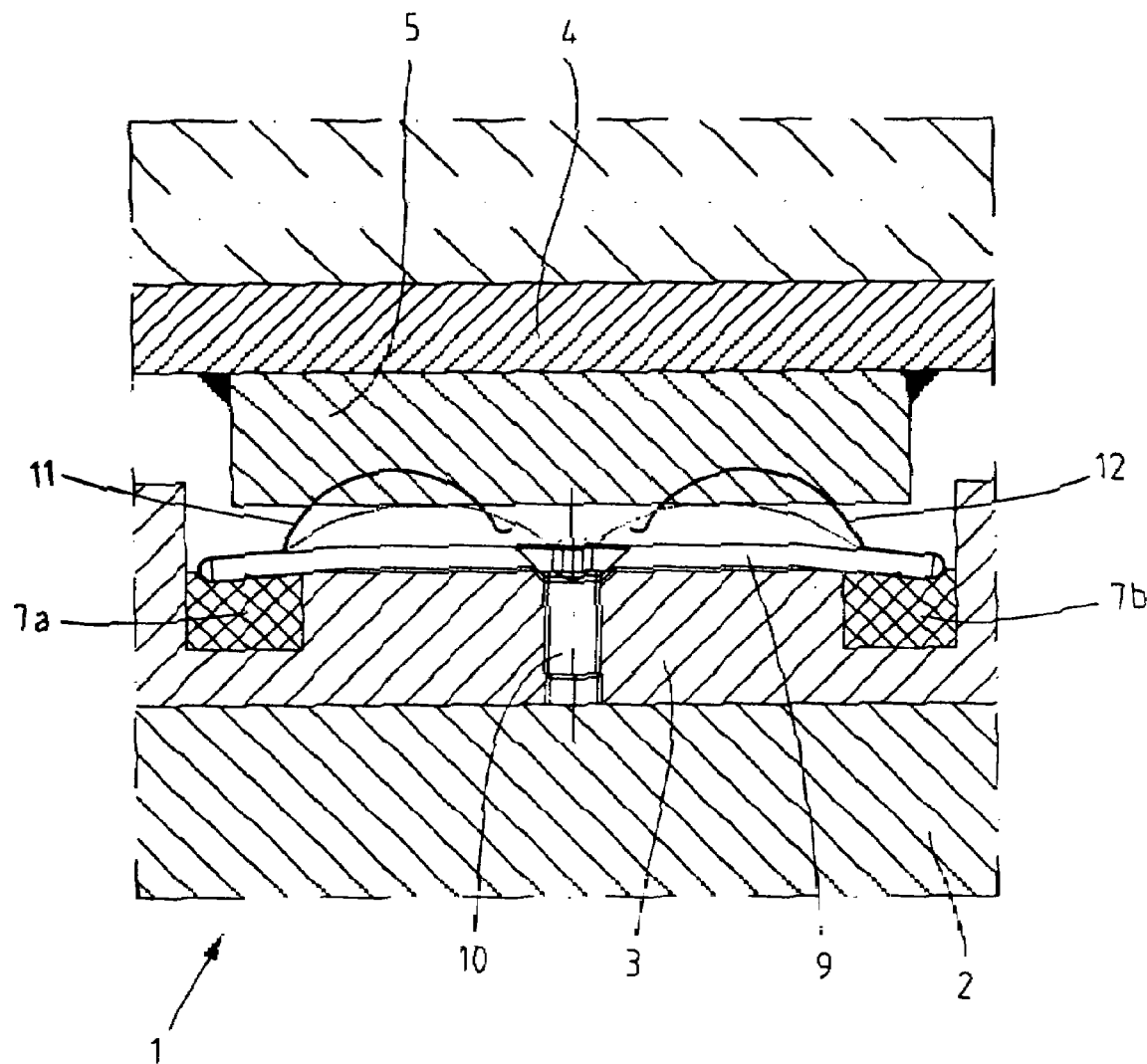
FIG. 1 is a schematic illustration of a known arrangement with electrically conductive spring contacts.

FIG. 1 shows an arrangement know per se on a revolving gate for shielding from electromagnetic pulses. The arrangement shown in FIG. 1 is provided on the periphery of a revolving gate and is provided for abutment against an installation frame which is made from metal or steel and is inserted on the building side. According to the known arrangement, there is provided on the gate denoted by 1, on the side facing the opening in the building, a gate construction 2 comprising a plate or strip 3 which, in proximity to the lateral edges of the gate, is preferably completely peripheral in configuration and is attached to the gate 1 in that position which, when the gate is closed, opposes the building-side installation frame 4.

A corresponding rabbet 5 extending horizontally and/or vertically is attached to the installation frame 4. Two parallel channels 7a, 7b are provided in the strip 3. These channels or grooves 7a, 7b contain lines of electrically conductive fabric 8a, 8b which are electrically contacted using a biased spring 9, the spring 9 being fastened to the strip 3 by screws 10 or the like. The spring 9 may be provided in the form of a spring strip extending over the entire length of the gate. The screwing means 10 fix one or more spring contacts 11, 12 relative to the strip 3 and cause, when the gate is closed, electrical contact between the strip 3, on the one hand, and the rabbet 5 on the building side, on the other hand. Although this arrangement can provide electrical shielding of the opening in the building via the gate, no air-tight seal is produced between the gate and building-side installation frame.

Figure 2:
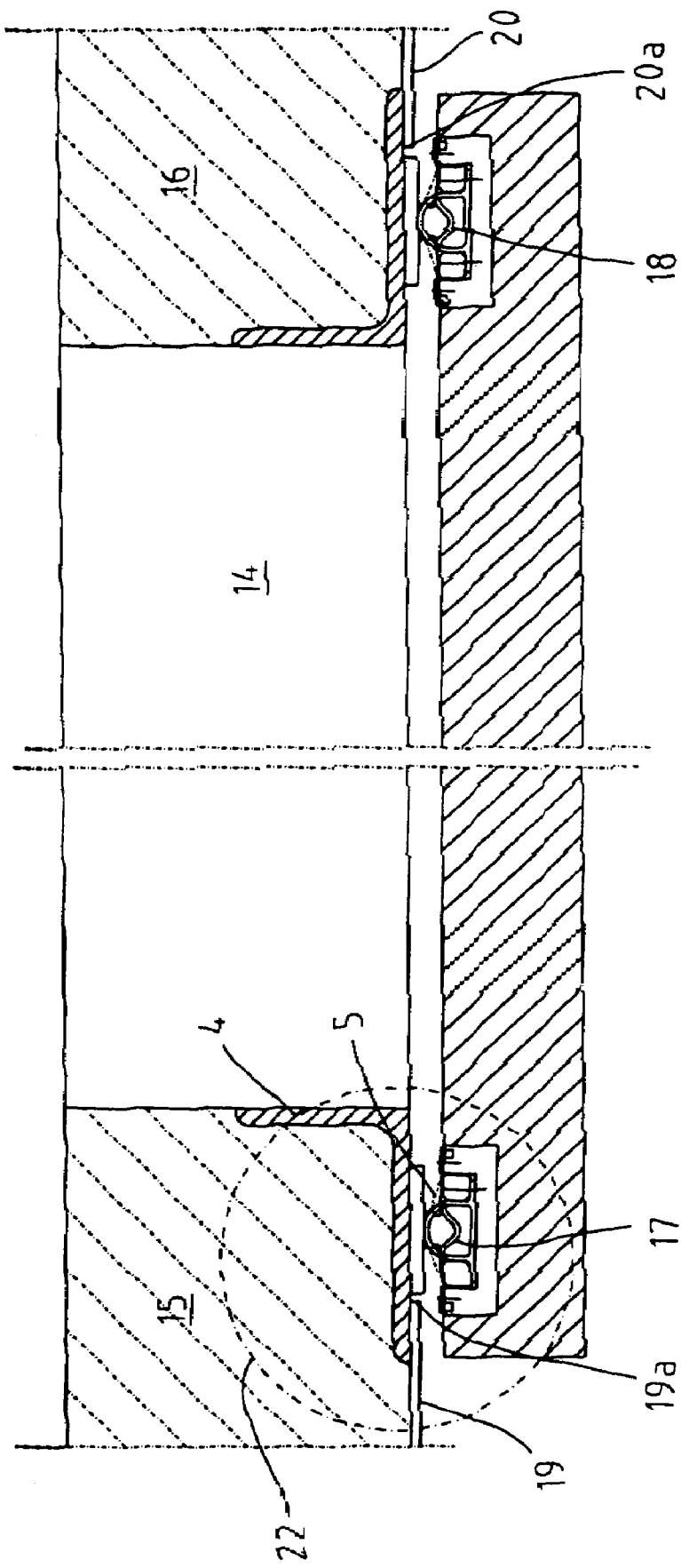
FIG. 2 is a schematic illustration of a gate relative to an opening in a building according to the invention.

FIG. 2 shows a schematic arrangement for illustrating a gate comprising a pneumatic seal relative to an opening 14 in a building. The walls of the building, shown laterally of the opening 14 in the building, are denoted by 15 and 16. FIG. 2 shows that the gate 1 comprises pneumatic seals 17, 18 associated with the installation frame 4 arranged on both sides of the opening 14 in the building. These seals 17, 18 are provided horizontally and vertically on the upper and lower sides of the gate given a corresponding installation frame in the opening in the building, i.e. if the installation frames of the opening 14 in the building are constructed, in addition to the vertical portions, so as to extend horizontally at the top and bottom. A completely peripheral pneumatic seal 17, 18 in the gate region is obviously preferred.

As may also be seen from FIG. 2, the outer face of the building is equipped with an electrically conductive fabric 19, 20 which touches or is in electrical contact with the building-side installation frame via a, for example transverse, end 19a, 20a.

Details of the region denoted by 22 in FIG. 2 will be described hereinafter in greater detail.

Figure 3:
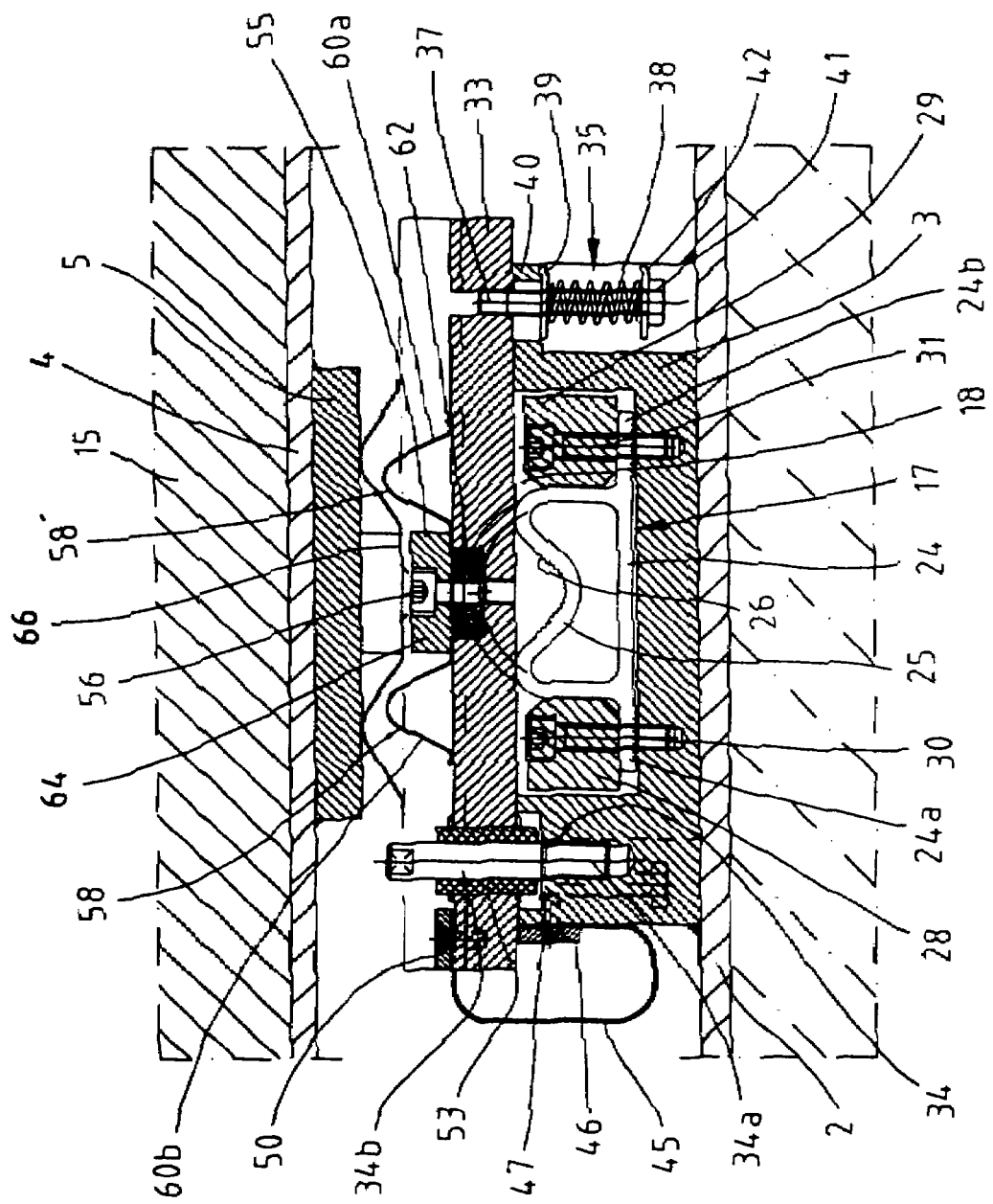
FIG. 3 is a partial view of a gate comprising a pneumatic seal and electric contact elements.

FIG. 3 shows a preferred embodiment which may advantageously be used in a sliding gate. According to FIG. 3, the gate according to the invention has an advanced gate construction 2 to which a strip, rail or plate 3 is attached, preferably welded. As may be seen from FIG. 2, a seal denoted by 17 should preferably be arranged peripherally on four sides of the inner face of the gate.

According to FIG. 3, the strip 3 comprises a substantially U-shaped groove 18 in which the substantially tubular seal 17 is located. The seal 17 comprises a base 24 provided with laterally protruding arms 24a, 24b used to fix the seal 17 relative to the strip 3.

The seal 17 has an adjustable face 25, i.e. an expandable portion 25, which is provided on its upper face with ribs, channels 26 or the like.

The seal 17 is secured to the strip or rail 3 in the region of the arms 24a, 24b extending transversely to the axis of the seal using clamping strips 28, 29 and by screwing means 30, 31 penetrating the clamping strips 28, 29. The screwing means 30, 31 are screwed into corresponding tapped holes in the strip 3 and thus clamp the arms 24a, 24b to the strip 3.

FIG. 3 shows the seal 17 both in the non-inflated state and in the inflated state. As may be seen, the groove 18 preferably extends peripherally on four sides of the face of the gate that is directed toward the building side. The height of the groove 18 and the height of the seal 17 are mutually adapted. The clamping strips 28, 29 are located within the groove 18, as FIG. 3 shows.

On the top of the seal 17 there is a plate 33 which is mounted by linear ball bearings 34 on one side of the seal 17 and by one or more compression spring units 35 on the other side. A preferably cylindrical part 34a of the linear ball bearing is fixed in the strip 3, whereas the associated counter part 34b which is preferably also cylindrical, in the form of a sleeve, is fixed in the plate 33. The compression spring unit 35, which consists of a guide pin 37 fixed in the plate 33 and a spring 38 supported against a shoulder 40 of the strip 3 by means of a disc 39 or the like, is used to assist the movement of the plate 33. The other end of the spring 38 is secured in a known manner to the lower end of the guide pin 37 by a nut 41 with a washer 42. The compression spring unit 35 thus serves to bias the plate 33 into a position in which the plate 33 rests on the surface of the substantially U-shaped strip 3. On the side opposing the compression spring unit 35 there is provided in proximity to the linear ball bearing units 34 an electrically conductive fabric tape 45, one end of which is fixed for example to the side of the strip 3 using a clamping strip 46 and corresponding screwing means 47 or the like. The other end of the fabric tape 45 is similarly attached to the plate 33 by a clamping strip 50 and screwing means 51. The important thing is that there is effective electrical contact between the fabric tape 45 and the strip 3, on the one hand, and the fabric tape 45 and the plate 33, on the other hand. In the embodiment illustrated in FIG. 3, the clamping strip 46 is fastened laterally to the strip 3, whereas the fabric tape 45 is attached to the upper face of the plate 33 using the strip 50 in proximity to the outer edge of the plate 33. Moreover, in the embodiment shown in FIG. 3, the ball bearing portion 34b is surrounded by a sleeve made from non-metallic material, which sleeve is denoted by 53 and is inserted together with the portion 34 into a corresponding hole in the plate 33.

On the top of the plate 33 there is, again, a clamping strip 55 which is attached to the upper face, for example in the centre of the plate 33, by screwing means 56 and is used for supporting spring contacts 58, 58'. The spring contact 58, 58' are preferably shaped in such a way that their end portions are substantially V-shaped, whereas the end in FIG. 3 is formed in the manner of a hook or as a tapering, curved end in such a way that the hook-shaped end 60a may be moved conductively to the side in the event of contact with the rabbet 5 in FIG. 3. The same applies to the left-hand spring end 60b which is moved toward the left in the event of the spring contacting the rabbet 5 in FIG. 3. The important thing is therefore that the two spring ends are adjustable relative to the rabbet 5 or relative to the plate 3 when the seal 17 is inflated and the spring contacts 58, 58' are thus pressed toward the rabbet 5.

Figure 4:
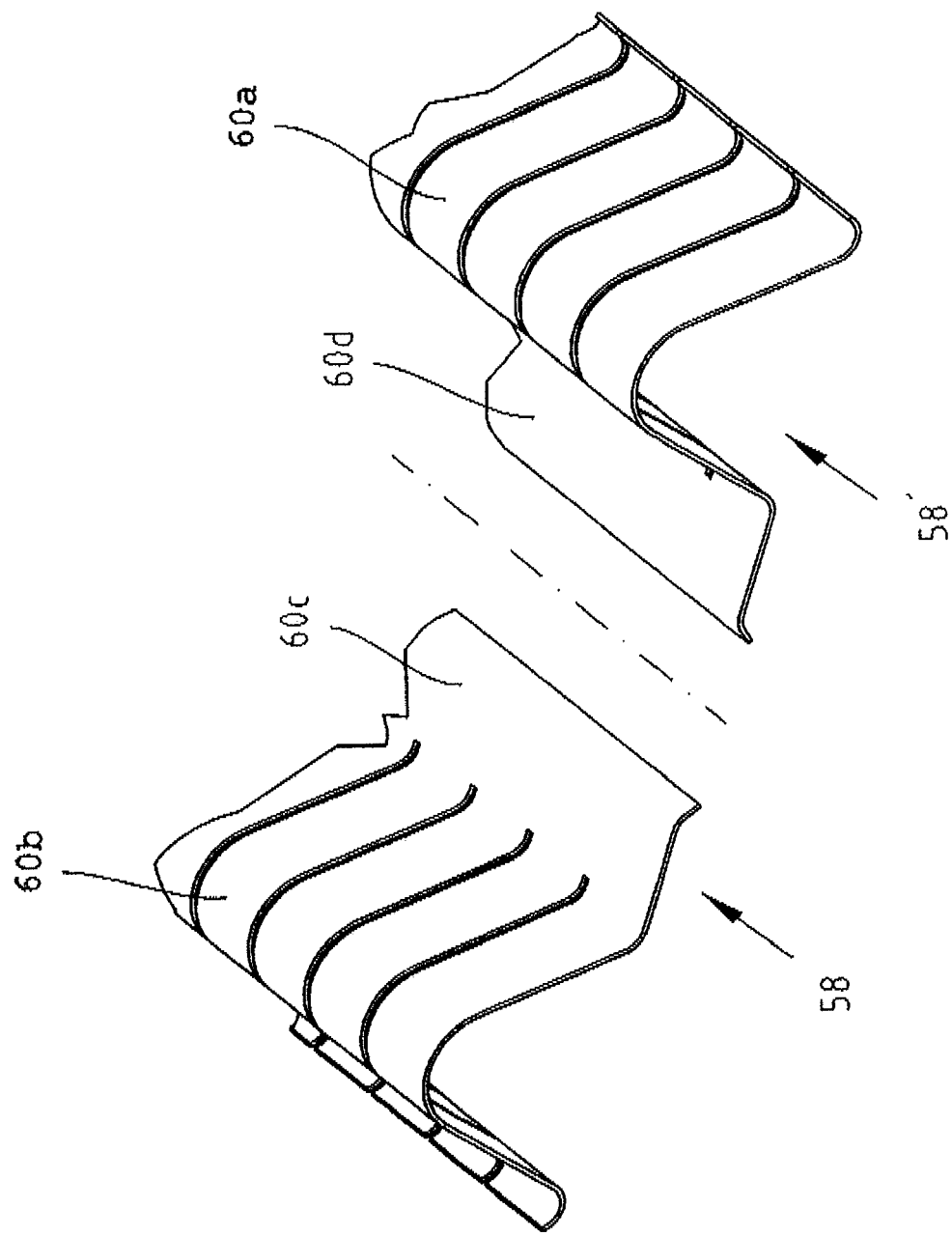
FIG. 4 is a schematic perspective view of the spring contact arrangement.

In FIGS. 3 and 4, two spring contact elements arranged mirror-symmetrically to each other are shown as the spring contacts 58, 58'. The lateral base denoted by 60c, 60d is clamped by the clamping strip 55. In an embodiment, the bases 60c, 60d may overlap or be superimposed on each other. In a further embodiment, a single spring contact, preferably shaped mirror-symmetrically, is used instead of a pair of spring contacts 58, 58'.

The gate seal operates as follows:

When the seal 17 is subjected to pressure, which may be at from 0.1 to 0.5 bar, the linear ball bearing units 34, as a guide on the one side, and the compression spring means 35, which at the same time act as guides on the other side, cause upward adjustment of the plate 33 in FIG. 3 once the sliding gate has assumed its closed position and the pressure effect of the seal 17 is accordingly used to displace the plate 33. The upward adjustment of the plate 33 in FIG. 3, i.e. in the direction of the opening in the building, causes the spring contacts 58 to be pressed toward the rabbet 5, thus causing electrical contact between the plate 33, on the one hand, and the rabbet 5 of the installation frame 4, on the other hand. As the rabbet 5 is rigidly connected, for example welded, to the installation fame 4, there is direct electrical contact between both parts. The fabric tape 45 is also used as an electrical conductor for establishing electrical contact between the plate 33, on the one hand, and the strip 3 or the remaining gate construction 2, on the other hand.

This ensures that the opening in the building is electrically bridged to the fabric tape 5 using the described sealing construction, relative to the electrically conductive fabric layer 19 located on the outer wall of the building (FIG. 2).

If the air pressure of the seal 17 is eliminated, the effect of the compression spring 35 causes the plate 33 in the described arrangement to move back toward the strip 3, i.e. in the direction of the gate construction 2, as a result of which the contact between the plate 33 or strip 3 and rabbet 5 is released and the gate may be opened.

In order to ensure effective electrical contact between the spring contacts 58 and 58' and the plate 33, the plate 33 has in the bearing region 62 of the clamping strip 55 a groove-like recess for receiving an electrically conductive fabric to which or into which the spring contacts 58, 58' may extend. In any case, the clamping strips 55 establish effective electrical contact between the plate 33 and lines of fabric or strips of fabric 64 inserted into the groove 62.

If air-tight closure is desired, the rabbet 55 may be provided with a seal 66, indicated by broken lines in FIG. 3, wherein the seal 66 may be formed by upwardly directed ribs or channels and presses tightly against the rabbet 5 in the event of pressure being exerted on the seal 17.

As described above, the arrangement shown in FIG. 3 is provided on the side of the gate directed toward the face of the building, peripherally on the four sides of the gate, as indicated by FIG. 2.

The arrangement according to the invention of a seal 17 for displacing the plate 33 in the direction of the rabbet 5 in conjunction with the spring contacts 58 and optionally flexible seals 66 made from rubber or the like ensures not only electrical bridging of openings in buildings but also air-tight closure of the building opening.

In the embodiment in FIG. 3, seals made from rubber or another flexible material are preferably used as the seal 17 and/or seal 66. The strips of fabric or lines of fabric 64 inserted into the groove 62 are preferably made from a copper material having high electrical conductivity. In their end portions 60a, 60b, the springs 58, 58' are preferably slotted transversely to the axis of the seal 17 (FIG. 4), whereas they are or may be continuous in their construction, in the form of continuous strips, in the region of the clamping strip 55. As may be seen, the spring contacts 58, 58', like the seals 17, are also provided peripherally on the gate construction 2. Gates or sliding gates of the type shown in FIG. 3 are gates weighing from 150 to 400 t; the pressure of the seals 17 is to be selected accordingly, in order to ensure fixed contact between the gate itself, on the one hand, and the installation frame 4, on the other hand.

EMC seals in the form of lines of fabric having dimensions of 10×10 mm are preferably still used as the fabric or line of fabric 64. The spring contacts 58, 58' are preferably made from CuBr.

The spring contacts 58, 58' are preferably formed in such a way that they are located along the clamping region between the plate 33 and the clamping strip 55 and are continuous, i.e. non-interrupted in construction, whereas the ends 60a, 60b are slotted in such a way that the slot width is preferably 1 mm. The spring tongues thus formed, i.e. the portions between the slots, preferably have a width of 6 mm.

The fabric tapes 45 are preferably provided peripherally on only one side of the strips 3, thus defining an electrical bridge between the edges of the opening in the building via the gate construction 2 or the strips 3.

FIG. 4 is a schematic view of the spring contact arrangement with spring end regions 60a and 60b corresponding to the view in FIG. 3. As may be seen from FIG. 4, only the ends of the spring contact arrangement are slotted. A slot width of 1 mm is preferred, the slot width being dependent on each application, i.e. the slot width is adapted to the wavelength or pulse length to be shielded.

The invention claimed is:

1. A gate with an at least partially arranged peripheral seal (17), with a retaining metal strip (3) comprising a U-shaped groove (18) in which the seal (17) is arranged, said seal (17) comprising a base (24) with protruding arms (24a, 24b) for fixing the seal (17) relatively to the strip (13), wherein the seal (17) is activated pneumatically, with an adjustable plate (33) which is located above the seal (17) and is guided by guide means (34, 35) so as to be adjustable relative to the retaining strip (3), with an electrically conductive fabric strip (45) which electrically connects the retaining strip (3) to the plate (33), and with electrically conductive spring contacts (58, 58') which are directly connected to the plate (33), and brought into and out of abutment with a rabbet (5) which is provided on an installation frame (4) being arranged on the building side,
   wherein said arms (24a, 24b) of the seal 17 are protruding laterally and are fastened in or to the strip (3) by clamping strips (28, 29).

2. The gate according to claim 1, wherein said spring contacts (58, 58') are fastened to the plate (33) by clamping strips (55).

3. The gate according to claim 1, wherein the spring contacts (58, 58') are provided with bent-down end portions (60a, 60b).

4. The gate according to claim 1, wherein the spring contacts (58, 58') are provided continuous in construction along a clamping strip (55) fastened to the plate (33).

5. The gate according to claim 1, wherein the electrically conduction fabric strip (45) is formed peripherally at least on a side of the retaining strip (3).

6. The gate according to claim 1, wherein said spring contacts (58, 58') are slotted at their ends (60a, 60b).

7. The gate according to claim 1,
   wherein the plate (33) with said spring contacts (58, 58') is provided with grooves (62) for receiving an electrically conductive fabric (64) on the top of the plate (33), said fabric (64) being in electrical contact with the spring contacts (58, 58').

8. The gate according to claim 1,
   wherein said spring contacts (58, 58') are fastened to the plate (33) by clamping strips (55) and wherein a flexible seal (66) is attached to the clamping strip (55).

* * * * *